United States Patent [19]
Navia et al.

[11] Patent Number: 5,175,669
[45] Date of Patent: Dec. 29, 1992

[54] SUPPORT MEMBER THAT COUPLES AN ELECTRONIC CARD TO A CHASSIS

[75] Inventors: Jaimie A. Navia, West Linn; Gregory M. Kuzmanich, Beaverton, both of Oreg.

[73] Assignee: Intel Corporatiton, Santa Clara, Calif.

[21] Appl. No.: 785,436

[22] Filed: Oct. 29, 1991

[51] Int. Cl.$^5$ .......................... H05K 7/18; H05K 7/14
[52] U.S. Cl. ..................................... 361/390; 361/415; 361/380; 361/429; 29/467; 439/327
[58] Field of Search ............... 29/467, 469; 211/41; 439/325, 327, 345, 347, 368; 361/415, 429

[56] References Cited

U.S. PATENT DOCUMENTS

| | | | |
|---|---|---|---|
| 4,435,029 | 3/1984 | McKenzie | 439/327 X |
| 4,552,426 | 11/1985 | Bettencourt et al. | 439/325 |
| 4,602,829 | 7/1986 | De Andrea | 439/368 X |
| 4,614,389 | 9/1986 | Albert et al. | 439/325 X |
| 4,840,570 | 6/1989 | Mann, Jr. et al. | 439/327 X |
| 4,964,810 | 10/1990 | Malotke et al. | 439/368 |

Primary Examiner—Leo P. Picard
Assistant Examiner—Michael W. Phillips
Attorney, Agent, or Firm—Blakely, Sokoloff, Taylor & Zafman

[57] ABSTRACT

A module support bracket that can support an electronic card plugged into a computer chassis. The bracket being constructed as a strip that has a first end with a pair of deflectable tabs adapted to be inserted into a first opening located in the front side of the chassis. The strip also has a second end constructed as a flat rectangular tongue adapted to be inserted into a second opening located in the back side of the chassis. After the electronic card is plugged into the chassis, the second end of the strip is inserted into the second opening. The first end is then inserted into the first opening to attach the strip to the chassis. The strip is also attached to the card, whereby the card becomes structurally coupled to the chassis.

8 Claims, 2 Drawing Sheets

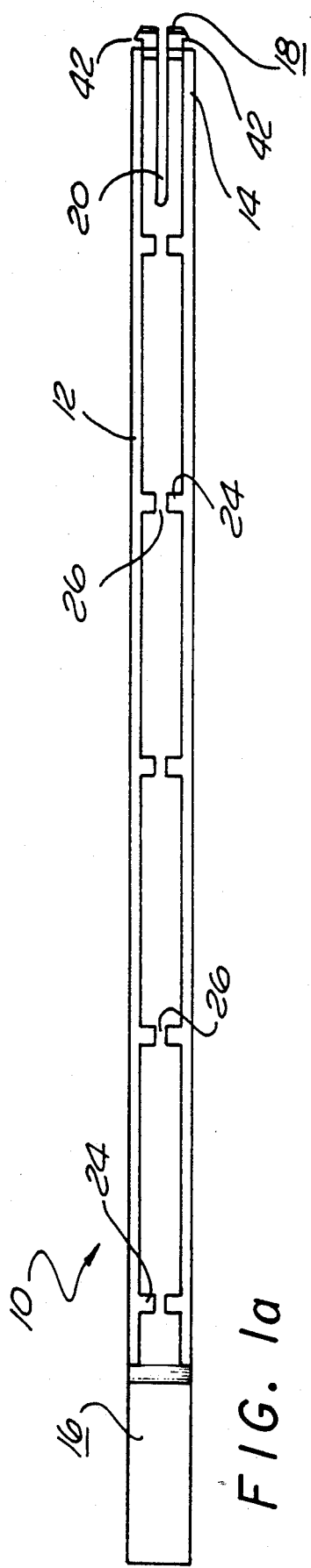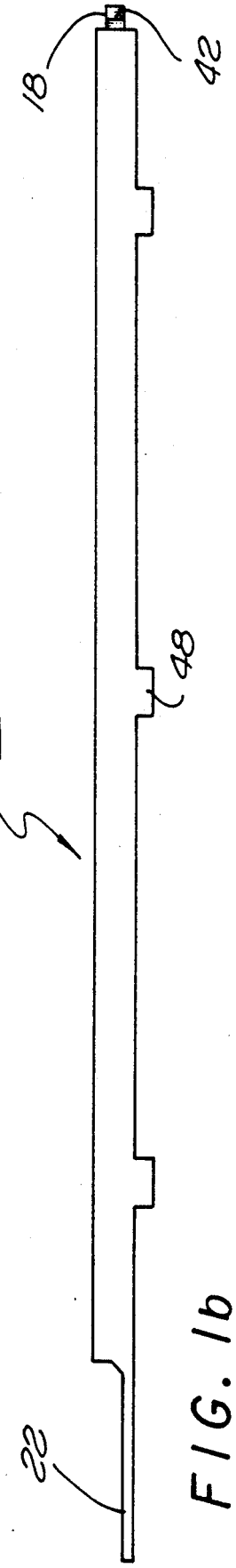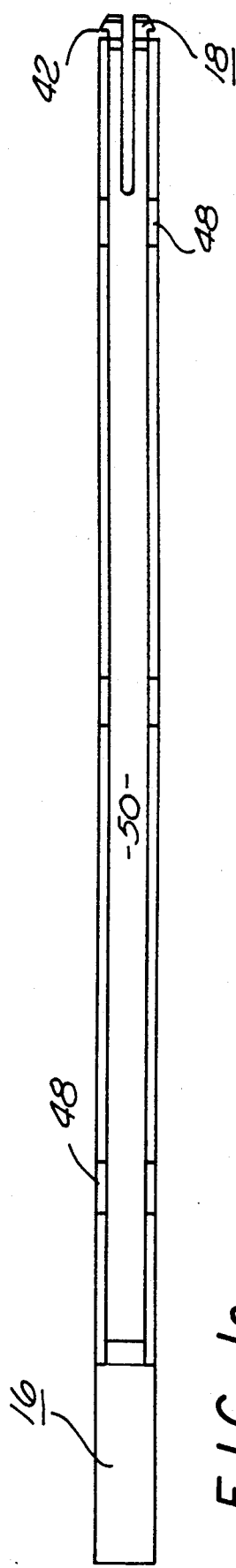

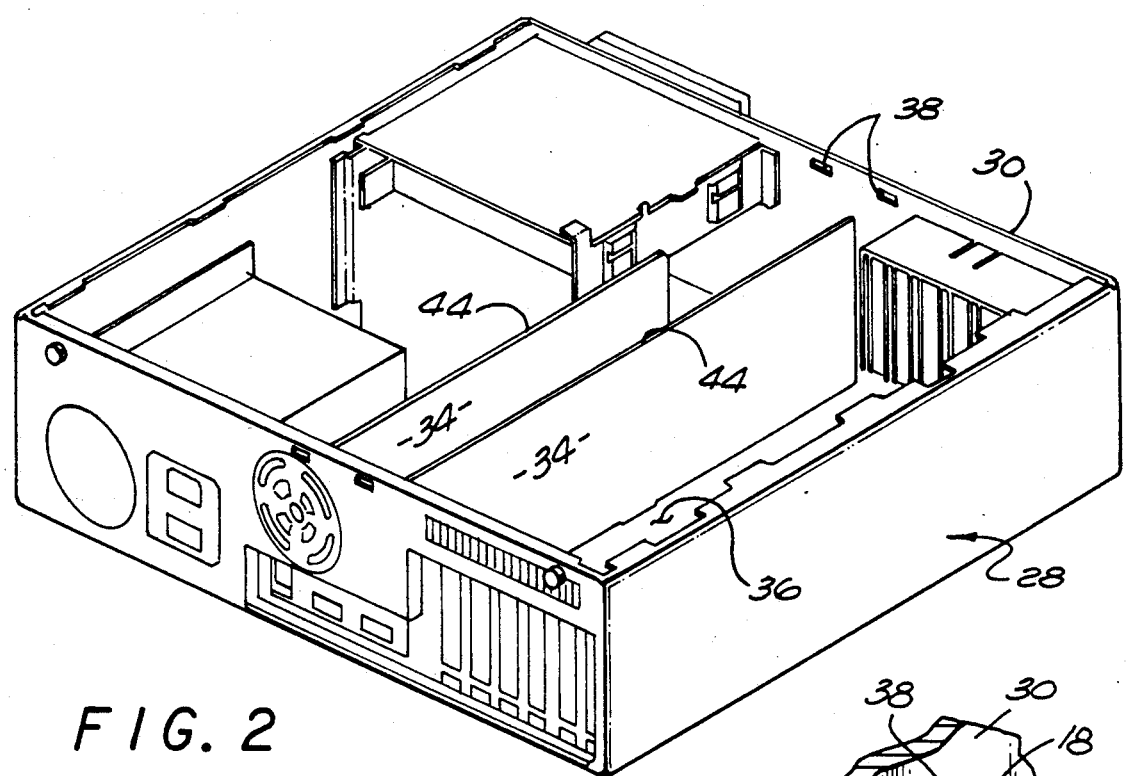
FIG. 2
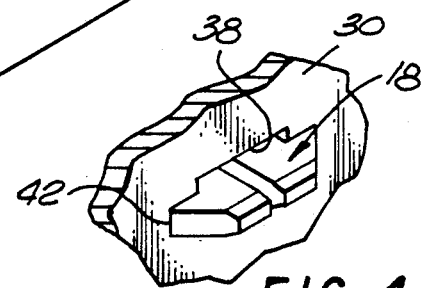
FIG. 4
FIG. 3
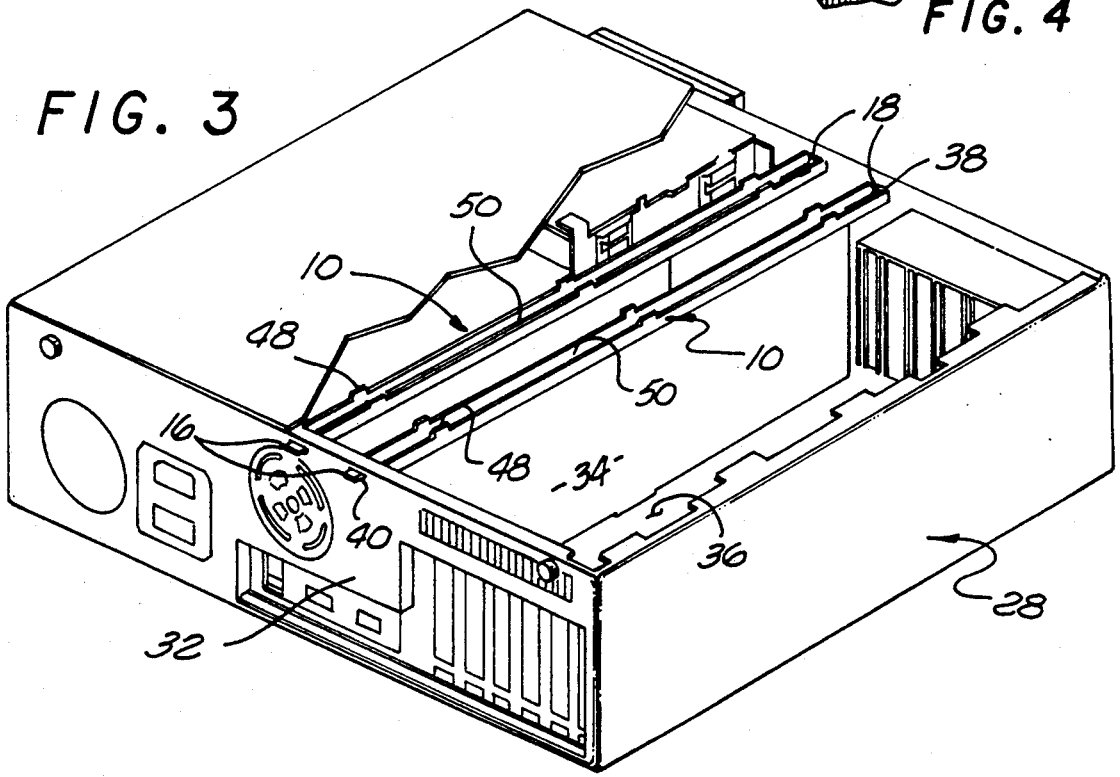

SUPPORT MEMBER THAT COUPLES AN ELECTRONIC CARD TO A CHASSIS

BACKGROUND OF THE INVENTION

1. Field of the Invention

The present invention relates to an electronic card assembly that can be plugged into a computer.

2. Description of Related Art

Computer systems typically have a chassis that contains a variety of electronic devices. The devices are usually mounted onto an electronic card, that can be inserted into the computer and plugged into a motherboard located at the base of the chassis. Computers are commonly packaged and shipped with the electronic cards installed inside the chassis. While handling and transporting the computers, the cards may become subject to shock and vibrational loading, which can rattle and damage the cards. Some computer manufacturers place foam or other padding between the cards, to limit and dampen the movement of the cards within the chassis. Although effective, the foam must be removed by the end user. Such a procedure typically requires the removal of screws and a cover. Additionally, the padding may break off and create foreign debris within the computer. It would therefore be desirable to having an apparatus that would support an electronic card within a chassis and reduce the damage to the card caused by shock or vibration.

SUMMARY OF THE INVENTION

The present invention is a module support bracket that can support an electronic card plugged into a computer chassis. The bracket being constructed as a strip that has a first end adapted to be inserted into a first opening located in the front side of the chassis. The strip also has a second end adapted to be inserted into a second opening located in the back side of the chassis. After the electronic card is plugged into the chassis, the second end of the strip is inserted into the second opening. The first end is then inserted into the first opening to attach the strip to the chassis. The strip is also attached to the card, whereby the card becomes structurally coupled to the chassis.

The strip is adapted to be attached to the edge of the card, to provide structural support and limit the amount of relative movement between the card and the chassis. The bracket can be easily installed and removed without any tools or fasteners.

Therefore it is an object of this invention to provide an apparatus that can structurally support an electronic card within a chassis, thereby reducing the amount of damage caused by vibration and shock.

It is also an object of this invention to provide an electronic card support bracket that can be easily installed and disassembled.

BRIEF DESCRIPTION OF THE DRAWINGS

The Objects and advantages of the present invention will become more readily apparent to those skilled in the art after reviewing the following detailed description and accompanying drawings, wherein:

FIG. 1a is a top view of a module support bracket of the present invention;

FIG. 1b is a side view of FIG. 1a;

FIG. 1c is a bottom view of FIG. 1b;

FIG. 2 is a perspective view of a computer chassis with an electronic card plugged into the computer;

FIG. 3 is a perspective view of the computer chassis of FIG. 2, with a module support bracket installed into the chassis;

FIG. 4 is a perspective sectional view showing the bracket attached to the front side of the computer chassis.

DETAILED DESCRIPTION OF THE INVENTION

Referring to the drawings more particularly by reference numbers, FIGS. 1a-1c show a module support bracket 10 of the present invention. The bracket 10 is constructed as a single strip 12 that has a first end 14 and a second end 16. The strip 12 is preferably constructed from a glass filled polycarbonate that can be injection molded, although other materials and processes may be used. The strip 12 has an I beam cross-section which provides a support member that is both light and strong. The first end 14 of the strip 12 has a pair of first tabs 18 separated by a first slot 20. The second end 16 is preferably shaped as a flat lip 22. Along the top of the strip 12 are pairs of ribs 24 separated by second slots 26.

FIG. 2 shows a computer chassis 28, typically used for a personal computer otherwise known as a PC. Although a PC type chassis 28 is shown and described, it is to be understood that the present invention can be used in any electronic assembly. The chassis 28 is rectangular in shape and has a front side 30 and a back side 32. A number of electronic cards 34 are connected to a motherboard 36 located at the base of the chassis 28. The cards 34 can be installed by inserting the cards 34 into the chassis 28, until the connectors (not shown) of the card 34 and motherboard 36 are coupled together, as is known in the art. The motherboard 36 allows the cards to communicate with each other and to other peripheral devices. The front side 30 and back side 32 have first 38 and second openings 40, respectively.

As shown in FIG. 3, after the card 34 is installed into the chassis 28, the bracket 10 is assembled onto the card 34. The bracket 10 may be installed by inserting the second end 16 of the strip 12 into the second opening 40 and then inserting the first end 14 into the first opening 38. The second end 16 is smaller than the second opening 40, so that the strip 12 can be easily connected to the back side 32. The shape of the second end and second opening are similar so that the strip 12 does not have an undesirable amount of movement relative to the back side 32.

The first tabs 18 each have a protrusion 42 constructed so that when the first end 14 is inserted into the first opening 38, the protrusions 42 engage the front side 30 and deflect the tabs 18 inward. As shown in FIG. 4, the first end 18 is further inserted until the protrusions 42 extend past the first opening 38, whereby the tabs 18 expand outward to fasten the strip 12 to the chassis 28. The bracket can be removed from the front side 30 by depressing the tabs 18 inward and pulling the first end 14 back through the first opening 38. The protrusions 42 may have a taper to allow the same to be easily inserted into the first opening 38. Likewise, the top surface of the tabs 18 may have chamfers to allow easy insertion into the opening 38.

As shown in FIG. 2, the card 34 has an edge 44 that fits within the second slots 26, when the ends of the strip are attached to the sides of the chassis 28. The edge 44 can have a width greater than the width of the slots 26, such that the strip 12 snaps onto the card 34. The ribs 24 laterally restrain the edge of the card 34, structurally coupling the card 34 to the chassis 28. The strip 12 extends along the entire edge of the card, to provide additional stiffness along the longitudinal axis. The chassis 28 typically has a cover 46 that can enclose the electronic cards 34. The strip 12 may have second tabs 48 that are spaced a predetermined distance from the cover 46. During vibration or shock, the tabs 48 can abut the cover 46 to provide a limit on the vertical movement of the card 34. The strip 12 thereby provides structural support for the card 34 and limits the amount of movement between the card 34 and chassis 28, particularly when the two members are subject to shock or vibrational loading. The top channel 50 of the strip 12 may also provide a duct, which can route wires and cables across the chassis 28.

While certain exemplary embodiments have been described in detail and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A module support bracket that can support an electronic card having at least one edge, the electronic card being adapted to be plugged into a computer chassis that has a first opening in a front side of the chassis and a second opening in a back side of the chassis, said module support bracket comprising:

a strip adapted to be structurally coupled to the edge of the electronic card, said strip having a first end that has a pair of tabs separated by a slot, said tabs being adapted to be deflected and inserted into the first opening such that said strip is attached to the front side of the chassis, said strip further having a second end constructed as a flat rectangular tongue that is adapted to be inserted into the second opening such that said strip is connected to the back side of the chassis.

2. The bracket as recited in claim 1, wherein said tabs each have protrusions that can be operatively connected to the front side, such that said tabs must be deflected to disengage said strip from the front side.

3. A computer assembly, comprising:

a chassis that has a front side and a back side, said front side having at least one first opening and said back side having at least one second opening;
    at least one electronic card plugged into said chassis, said electronic card having an edge; and,
    a strip attached to said edge of said electronic card, said strip having a first end that has a pair of first tabs separated by a first slot, said pair of first tabs being adapted to be deflected, said pair of first tabs being disposed in said first opening such that said strip is attached to said front side of said chassis, said strip further having a second end constructed as a flat rectangular tongue that is disposed in said second opening such that said strip is connected to said back side of said chassis.

4. The assembly as recited in claim 3, wherein said first tabs each have protrusions that are operatively connected to said front side, such that said first tabs must be deflected to disengage said strip from said front side.

5. The assembly as recited in claim 3, wherein said strip has at least one pair of ribs separated by a second slot, said electronic card has an edge that is disposed within said second slot so as to structurally couple said strip to said electronic card.

6. The assembly as recited in claim 3, further comprising a cover enclosing said electronic card within said chassis, said strip having at least one second tab spaced a predetermined distance from said cover.

7. A computer assembly, comprising:

a chassis that has a front side and a back side, said front side having at least one first opening and said back side having at least one second opening;
    at least one electronic card plugged into said chassis, said electronic card having an edge;
    a cover enclosing said electronic card within said chassis; and,
    a strip having at least one pair of ribs separated by a second slot receiving said edge of said electronic card so as to secure said strip to said electronic card, said strip having a first end that has a first pair of tabs separated by a first slot, said pair of first tabs being adapted to be deflected, said pair of first tabs being disposed in said first opening such that said strip is attached to said front side of said chassis and a second end constructed as a flat rectangular tongue that is disposed into said second opening such that said strip is connected to said back side of said chassis, said strip further having at least one second tab spaced a predetermined distance from said cover.

8. The assembly as recited in claim 7, wherein said first tabs each have protrusions that are operatively connected to said front side, such that said first tabs must be deflected to disengage said strip from said front side.

* * * * *